(12) United States Patent
Liu et al.

(10) Patent No.: US 10,475,891 B2
(45) Date of Patent: Nov. 12, 2019

(54) RELIABLE NON-VOLATILE MEMORY DEVICE

(71) Applicant: GLOBALFOUNDRIES Singapore Pte. Ltd., Singapore (SG)

(72) Inventors: Jin Qiu Liu, Singapore (SG); Fan Zhang, Singapore (SG); Lai Qiang Luo, Singapore (SG); Xin Shu Cai, Singapore (SG); Eugene Kong, Singapore (SG); Zhiqiang Teo, Singapore (SG); Fangxin Deng, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 87 days.

(21) Appl. No.: 15/286,592

(22) Filed: Oct. 6, 2016

(65) Prior Publication Data
US 2018/0102414 A1    Apr. 12, 2018

(51) Int. Cl.
*H01L 29/423*   (2006.01)
*H01L 29/66*    (2006.01)
*H01L 29/788*   (2006.01)
*H01L 27/24*    (2006.01)
*H01L 21/28*    (2006.01)
*H01L 29/78*    (2006.01)
*H01L 29/45*    (2006.01)

(52) U.S. Cl.
CPC .. *H01L 29/42328* (2013.01); *H01L 21/28273* (2013.01); *H01L 27/2436* (2013.01); *H01L 29/42344* (2013.01); *H01L 29/66659* (2013.01); *H01L 29/66825* (2013.01); *H01L 29/788* (2013.01); *H01L 29/7835* (2013.01); *H01L 29/456* (2013.01); *H01L 29/665* (2013.01)

(58) Field of Classification Search
CPC ....... H01L 21/823437; H01L 21/82345; H01L 21/823456; H01L 21/82385; H01L 27/11517; H01L 29/42328; H01L 29/42344; H01L 21/26513; H01L 21/266; H01L 27/07
See application file for complete search history.

(56) References Cited

U.S. PATENT DOCUMENTS

| | | | | |
|---|---|---|---|---|
| 2014/0057422 A1* | 2/2014 | Liu | ................. | H01L 21/26586 438/510 |
| 2014/0264534 A1* | 9/2014 | Tsair | ................. | H01L 29/66825 257/316 |
| 2016/0181266 A1* | 6/2016 | Chuang | ............. | H01L 27/11541 257/316 |
| 2016/0336415 A1* | 11/2016 | Wu | ................. | H01L 29/42328 |

\* cited by examiner

*Primary Examiner* — Cheung Lee
(74) *Attorney, Agent, or Firm* — Thompson Hine LLP

(57) ABSTRACT

Device and method for forming a device are disclosed. The method includes providing a substrate prepared with a memory cell region having a pair of non-volatile memory cells with a split gate. A split gate includes first and second gates. The first gate is an access gate and the second gate is a storage gate with a control gate over a floating gate. A common second S/D region is disposed adjacent to second gates of the first and second memory cells and first S/D regions are disposed adjacent to the first gates of the first and second memory cells. An erase gate is disposed over the common second S/D region. The erase gate is isolated by the second S/D and second gates by dielectric layers. A silicide block is disposed over the memory cell pair, covering the erase gate at least portions of the second gates of the memory cells.

20 Claims, 21 Drawing Sheets

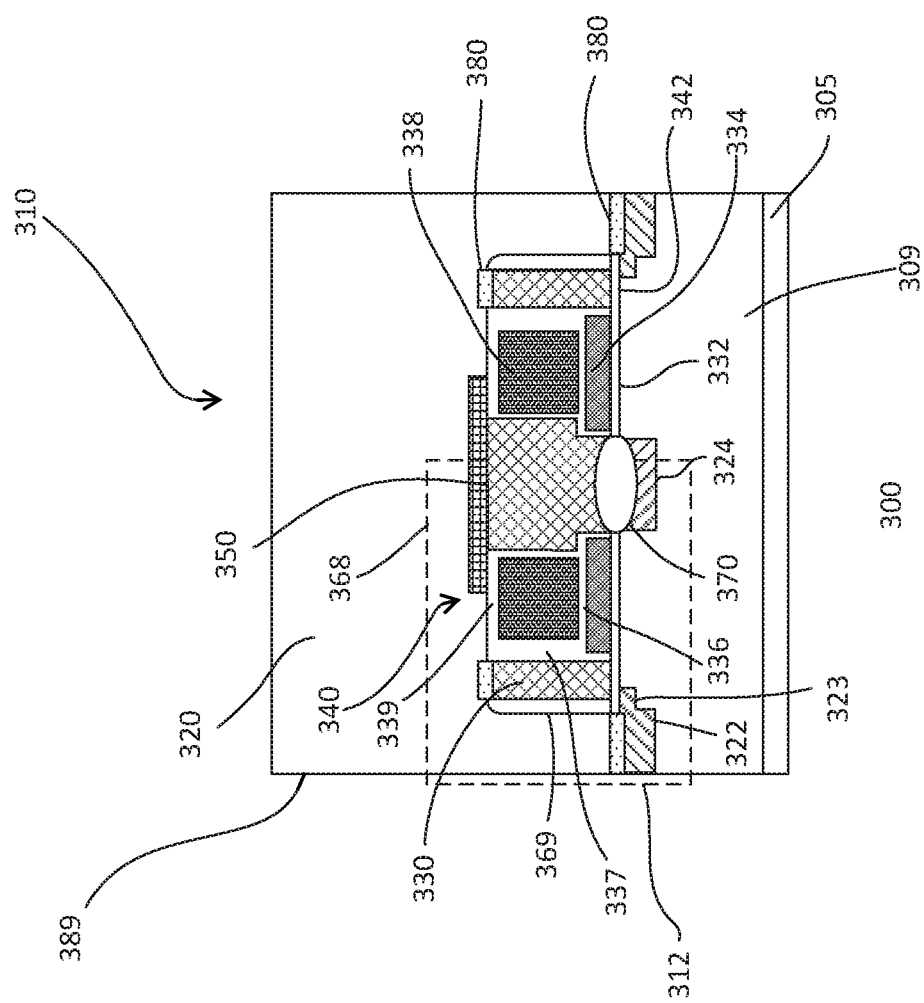

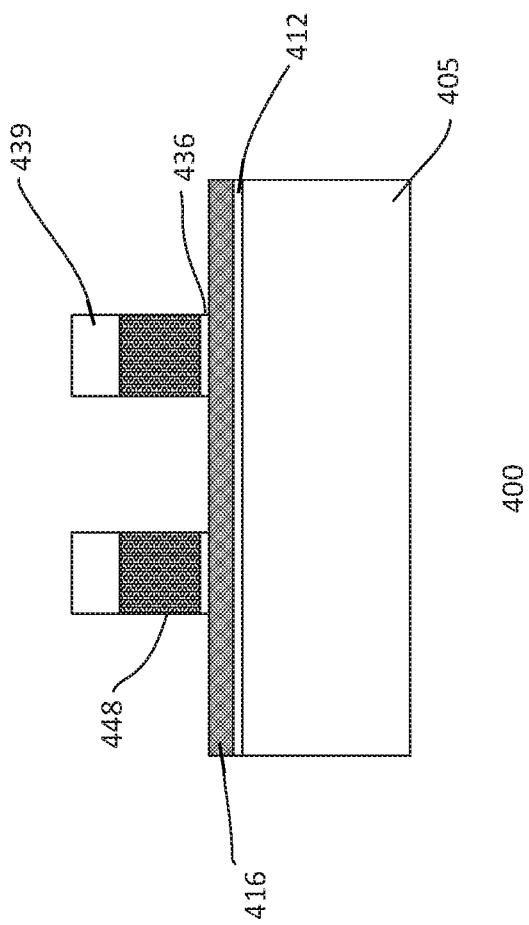

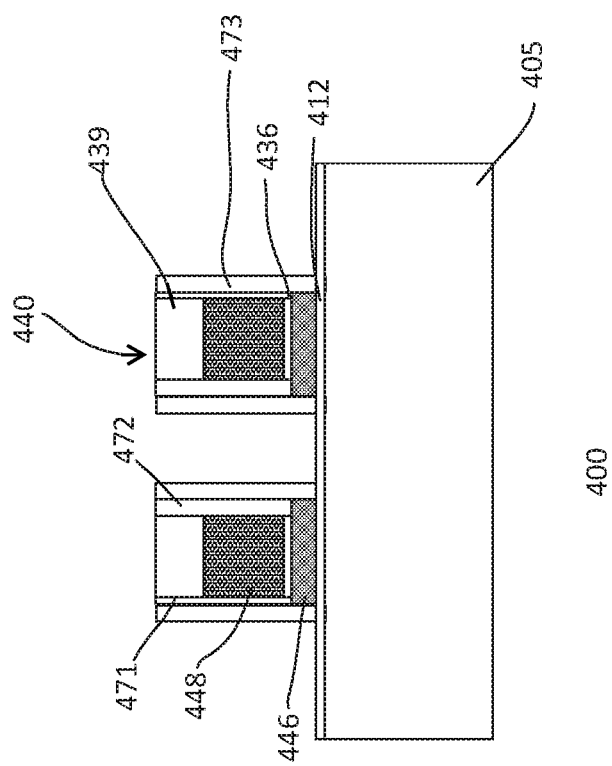

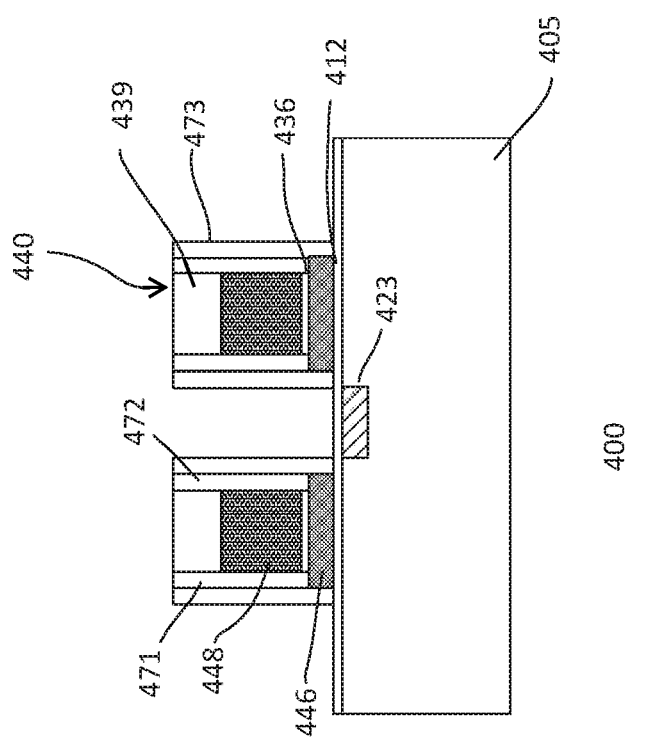

RELIABLE NON-VOLATILE MEMORY DEVICE

BACKGROUND

Non-volatile memory (NVM) devices are able to retain stored data even when the power supply is interrupted. Non-volatile memory devices include flash devices which can be programmed using electrical signals. A NVM device, for example, includes a memory transistor and a select or access transistor in series. The memory transistor stores data programmed into the memory cell, while the access transistor selects the memory cell to be programmed or erased.

The memory transistor can be of various types. For example, the memory transistor may have a stacked gate structure having a control gate over a floating gate and a storage layer sandwiched between control and floating gates. In addition, an erase gate is disposed over a source. During fabrication of the memory devices, we have observed that unwanted dopants from implants are trapped the tunneling oxide separating the floating gate and erase gate. This causes damage to the tunnel oxide. In addition, bridging between the erase gate and control gate may cause shorting. These issues cause defects or failures, impacting device yields.

The present disclosure is directed to a memory cell with improved performance and reliability and the method of forming thereof.

SUMMARY

Embodiments generally relate to semiconductor device and methods for forming a device. In one embodiment, a method for forming a NVM device is disclosed. The method includes providing a substrate prepared with a memory cell region and forming at least a memory cell pair having first and second memory cells on the memory cell region. The said memory cell pairs includes a first cell gate of the first memory cell, a second source/drain (S/D) region disposed between the second gates of the first and second cell gates, an erase gate dielectric disposed on the second S/D region and an erase gate disposed over the erase gate dielectric, as well as between the first and second cell gates. The method proceed with further processing which involves the implanting of dopants into the substrate using an implant mask to form first S/D regions adjacent to the first gates of the first and second cell gates.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following:

FIGS. 3a-3b show cross-sectional views of embodiments of devices with memory cells;

DETAILED DESCRIPTION

Embodiments generally relate to semiconductor devices. More particularly, some embodiments relate to memory devices, such as non-volatile memory (NVM) devices. Such memory devices, for example, can be incorporated into standalone memory devices, such as Universal Serial Bus (USB) or other types of portable storage units, or integrated circuits (ICs), such as microcontrollers or system on chips (SoCs). The devices or ICs can be incorporated into or used with, for example, consumer electronic products, or relate to other types of devices.

Figure 1:
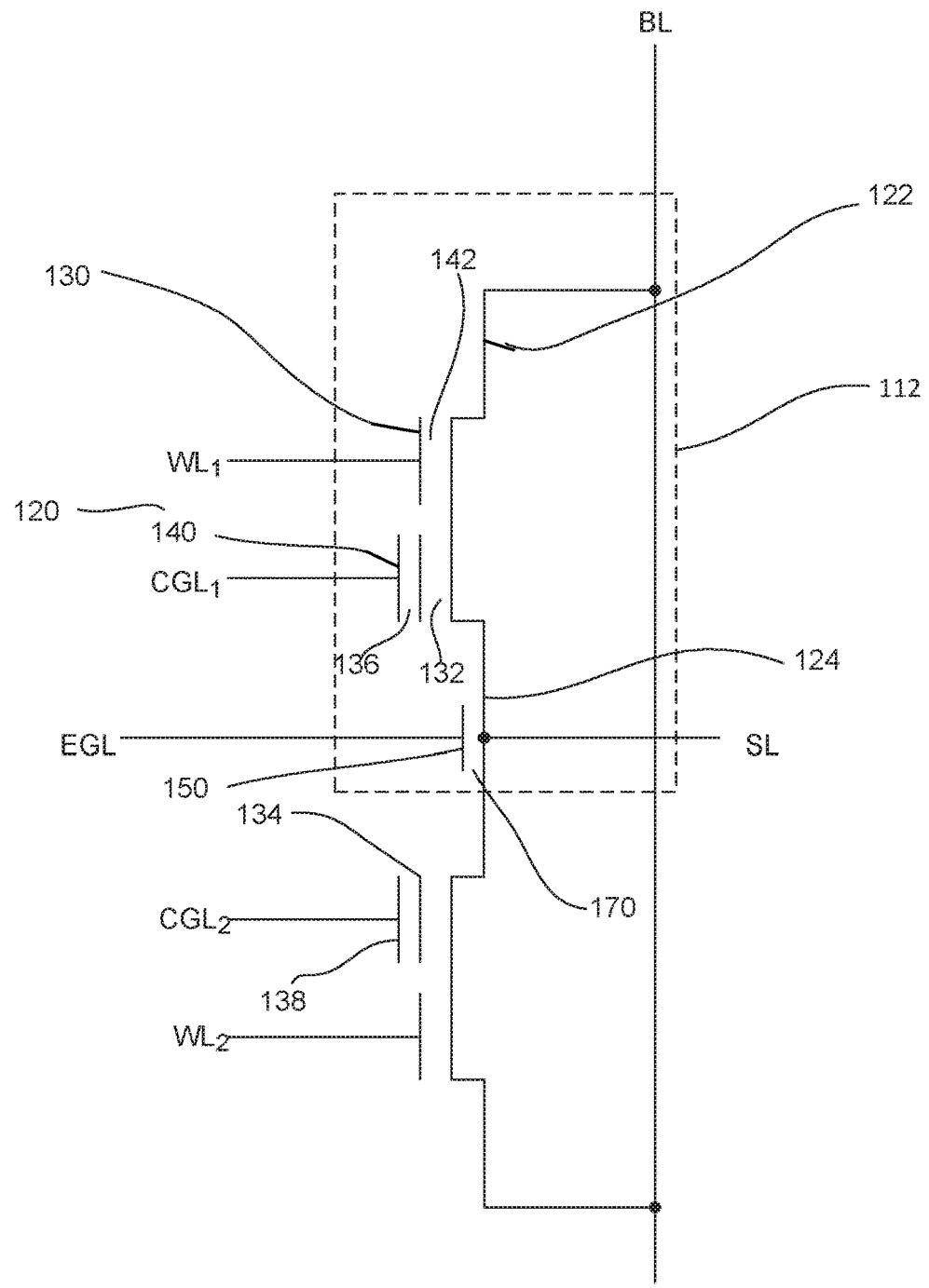
FIG. 1 shows a schematic diagram of an embodiment of a device.

FIG. 1 shows a schematic diagram of an embodiment of a device with a memory cell pair 110. For example, the memory cell pair includes first and second memory cells. The memory cells, in one embodiment, are NVM cells. Providing other types of memory cells may also be useful.

A memory cell 112 includes a cell transistor with a primary gate 120 between first and second terminals 122 and 124. The transistor may include a body (not shown). The body, for example, is a substrate. The substrate may be a semiconductor substrate, such as a silicon substrate. In one embodiment, the primary gate is disposed above the body or substrate while the terminals are disposed in the body. The primary transistor gate, in one embodiment, is a split gate. For example, the split gate includes first and second primary gates or gates 130 and 140. The first primary gate is adjacent to the first terminal and the second primary gate is adjacent to the second terminal.

The first primary gate 130 may be referred to as a select or access gate. As for the second primary gate 140, it may be referred to as a storage gate. The storage gate includes first and second storage gates 134 and 138. For example, the first storage gate is a floating gate 134 and the second storage gate is a control gate 138. The different gates may be polysilicon gates. Other types of gates may also be useful. The gates need not be made of the same material. As for the terminals 122 and 124, they may be heavily doped regions in the body. Other types of terminals may also be useful.

The different gates may be separated by each other as well as from the body by an intergate dielectric. The intergate dielectric may include multiple dielectric layers which serve different purposes. For example, different portions of the intergate dielectric may serve as gate dielectrics, storage dielectrics or insulating dielectrics. The different portions may have different configurations. The dielectric layers may include silicon oxide, silicon nitride and/or silicon oxynitride. Other combinations of dielectric layers may also be useful.

In one embodiment, the floating gate 134 is separated from the body of the transistor by a floating gate dielectric 132 and the control gate 138 is separated from the body of the transistor by a storage gate dielectric 136. The access gate 130 is separated from the body by an access gate dielectric 142. The access and floating gate dielectrics may be the same dielectric layer. Sidewall dielectrics may be provided to separate the first and second gates from each other. The sidewall dielectrics may be multiple sidewall dielectrics, forming sidewall dielectric stacks. As for the storage gate dielectric, it may be may be a storage dielectric stack. For example, the storage gate dielectric may be an oxide/nitride/oxide (ONO) stack. Other configurations of intergate dielectrics may also be useful.

The control gate is coupled to a control gate line (CGL); the access gate is coupled to a wordline (WL). The first terminal is coupled to a bitline (BL). As for the second terminal, it is coupled to a source line (SL). In one embodiment, the second terminal is a common terminal of the memory cells of the memory cell pair. The second terminal serves as a source line (SL).

The transistor includes a secondary gate 150. The secondary gate serves as an erase gate. The erase gate is provided over the second terminal. The erase gate is separated from the second terminal by an erase gate dielectric 170. The erase gate dielectric, for example, may form a part of the intergate dielectric. The erase gate dielectric, in one embodiment, includes a thermal dielectric, such as thermal silicon oxide. Other types of erase gate dielectrics may also be useful. The erase gate 150 is coupled to an erase gate line (EGL).

As illustrated, the memory cells of the pair share a common EGL and SL. For example, the second terminals of the first and second cell transistors form a common second terminal and the erase gate is a common erase gate for the first and second cell transistors. A first wordline (WL$_1$) is coupled to the access gate of the first cell transistor and a first control gate line (CGL$_1$) is coupled to the control gate of the first cell transistor; a second wordline (WL$_2$) is coupled to the access gate of the second cell transistor and a second control gate line (CGL$_2$) is coupled to the control gate of the second cell transistor. As for the first terminals of the cell transistors, they are coupled to a common bitline (BL). For example, the cells of the memory cell pair are part of the same column of memory cells. Memory cells may be interconnected by wordlines (WLs), control gate lines (CGLs), erase gate lines (EGLs), source lines (SLs) and bitlines (BLs) to form a memory array.

Figure 2:
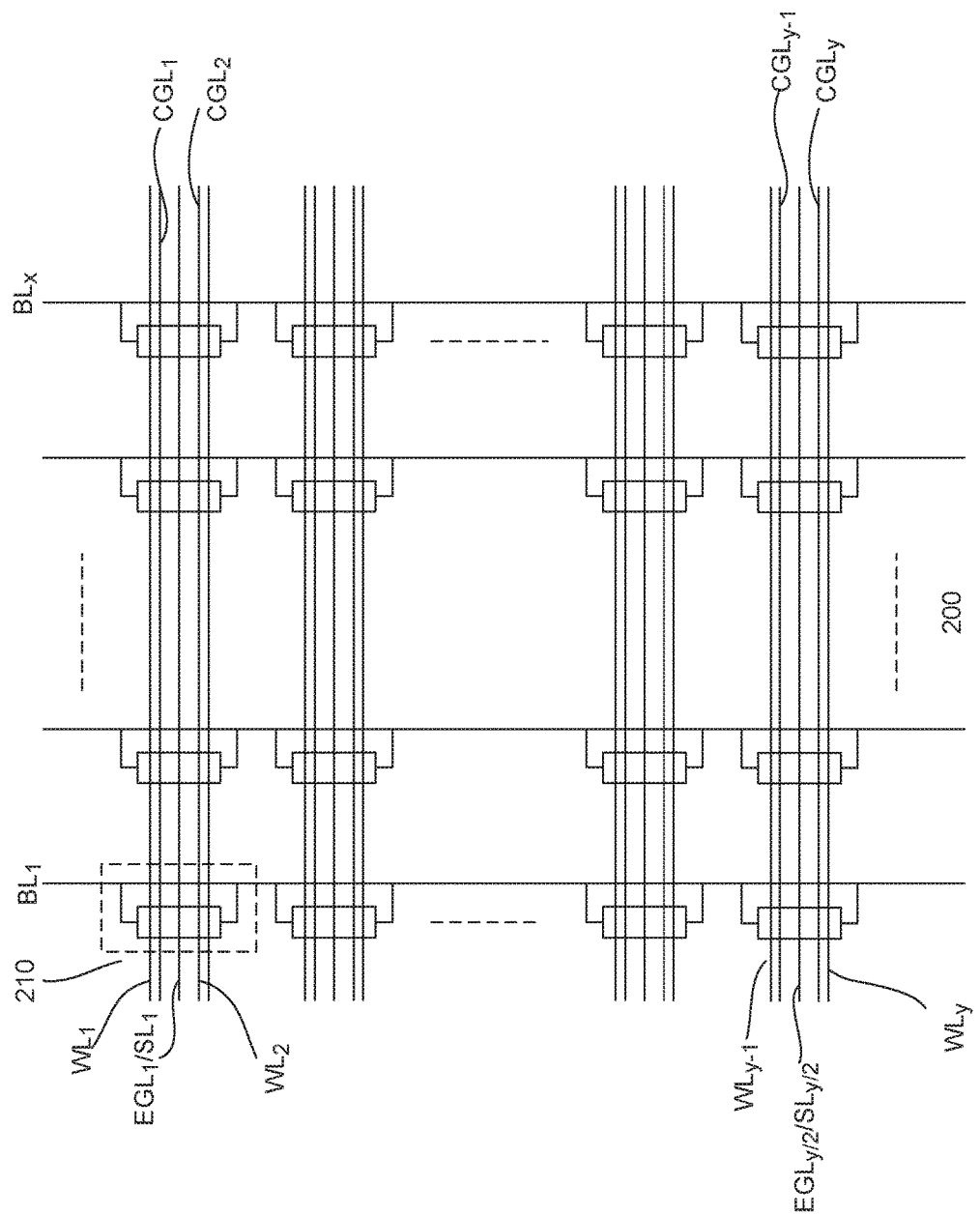
FIG. 2 shows an embodiment of a memory array.

FIG. 2 shows a plurality of memory cell pairs 210 configured to form a memory array 200. The memory cell pairs of the array are arranged in first and second directions. Memory cells are interconnected in the first direction by wordlines (WLs), control gate lines (CGLs), erase gate lines (EGLs), and source lines (SLs) to form rows of memory cells and in the second direction by bitlines (BLs) to form columns of memory cells. As shown, the array includes y rows and x columns of memory cells. Since EGLs and SLs are common to a pair of memory cells, there are y/2 EGLs and SLs.

Appropriate voltages may be applied to a memory cell via the BL, CGL, WL, EGL and SL to perform different memory operations. The different memory operations may include program, read and erase operations. Table 1 below shows exemplary biasing conditions of the memory array for selected and non-selected cells for different operations.

The biasing conditions as shown in Table 1 are exemplary. Other suitable biasing conditions may also be useful. The bias conditions may change, for example, based on technology node.

Figure 3B:
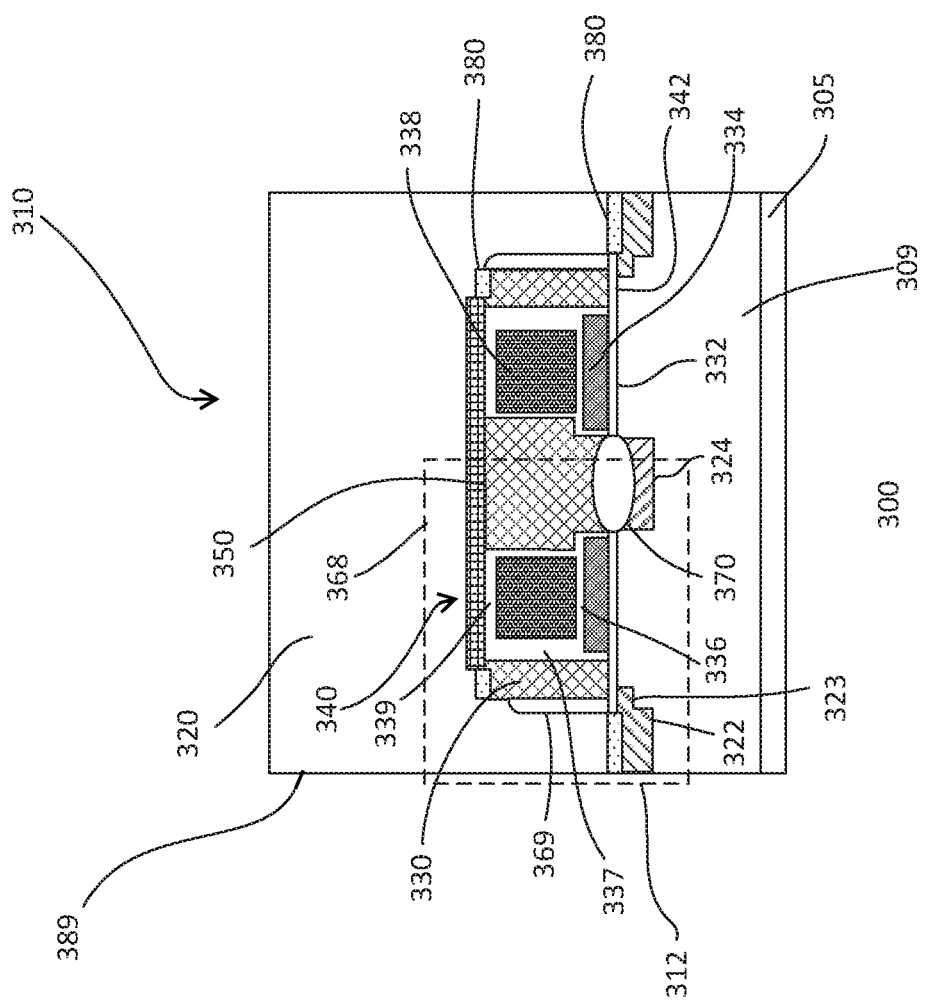

FIGS. 3a-3b show cross-sectional views of embodiments of a device 300. Referring to FIG. 3a, the device includes a substrate 305. The substrate, for example, may be a silicon substrate. The substrate can be lightly doped with p-type dopants. Other types of semiconductor substrates may also be used. For example, the substrate may be silicon germanium or silicon-on-insulator (SOI) as well as intrinsic or doped with other types of dopants or dopant concentrations.

The substrate may be prepared with a memory region containing memory cells of the device. The memory region can be referred to as an array region. Providing a substrate prepared with other types of regions (not shown) may also be useful. For example, the substrate may include a logic region for support or other types of logic circuitry. The substrate may also include regions for other types of circuitry, depending on the type of device or IC. For example, the logic region may include sub-regions for high voltage (HV), medium voltage (MV) and low voltage (LV) devices.

As shown, the memory region includes a pair of memory cells 310. For example, the pair of memory cells includes first and second memory cells 312. In one embodiment, the memory cells are NVM memory cells. Providing other types of memory cells may also be useful. The pair of memory cells may be adjacent memory cells of a column of memory cells. It is understood that the cell region includes numerous memory cells arranged in columns and rows to form a memory array. The array may be configured to have sub-arrays or sectors.

The array region may include a doped well 309 with dopants of a second polarity type. The doped well may be lightly or intermediately doped. For example, the doped well may have a dopant concentration of about 1E17 cm$^{-3}$. Providing a doped well having other dopant concentrations may also be useful. The dopant concentration, for example, may depend on the technology node. The doped well serves as the body of the transistors of the memory cells. The doped well may be a common doped well in the array region for the memory cells. In one embodiment, the array well is biased at an array well bias voltage ($V_{bias}$). In one embodiment, $V_{bias}$ is about 0V. The second polarity type doped well serves as a well for a first polarity type device. In one embodiment, the second polarity type includes p-type. For example, the p-type doped well serves as a well for a n-type memory cell. Providing a n-type doped well may also be useful. For example, a n-type doped well serves as a well for p-type memory cells. P-type dopants can include boron (B), aluminum (Al), indium (In) or a combination thereof while n-type dopants can include phosphorus (P), arsenic (As), antimony (Sb) or a combination thereof.

TABLE 1

| | Signal (V) | | | | | | | | | |
|---|---|---|---|---|---|---|---|---|---|---|
| | WL | | SL | | BL | | CGL | | EGL | |
| Operation | Sel | Un-sel | Sel | Un-sel | sel | Un-sel | sel | Un-sel | Sel | unsel |
| Read | $V_{CC}$ | 0 | 0 | $V_{ref1}$ | $V_{ref2}$ | $V_{CC}$ | 0 | 0 | 0 | 0 |
| Program | $V_t < V < V_{CC}$ | 0 | 4.5 | 0 | <1 | $V_{CC}$ | 10.5 | 0 | 4.5 | 0 |
| Erase | 0 | 0 | 0 | 0 | 0 | 0 | 0 | 0 | 11.5-12.5 | 0 |

The substrate includes isolation regions (not shown) to isolate active device regions from other active device regions, as required. The isolation regions, for example, are shallow trench isolation (STI) regions. Other types of isolation regions are also useful. For example, isolation regions may be used to isolate rows and columns of memory cells.

A memory cell includes a cell transistor with a gate 320 between first and second cell terminals or source/drain (S/D) regions 322 and 324. The gate, in one embodiment, is a split gate. For example, the split gate includes first and second gates 330 and 340. The second gate, for example, is a storage gate. The storage gate includes a control gate 338 and a floating gate 334. The gates, for example, are polysilicon gates. The gates may be formed by, for example, chemical vapor deposition (CVD). Other suitable types of gates or forming techniques may also be useful.

The gates are separated by an intergate dielectric. The intergate dielectric may include a plurality of dielectric layers which may serve different purposes. For example, different portions of the intergate dielectric may serve as gate dielectrics, storage dielectrics, insulating dielectrics between the first and second gates or hard mask dielectrics. The different portions may have different configurations. For example, some may be a single dielectric layer while others may be a combination of layers. The dielectric layers may include silicon oxide, silicon nitride and/or silicon oxynitride. Other combinations of dielectric layers may also be useful.

In one embodiment, the access and floating gates 330 and 334 are separated from the substrate by a gate dielectric 332. As shown, the gate dielectric for both gates may be the same gate dielectric. Providing the gates with separate dielectrics may also be useful. The gate dielectric may be thermal silicon oxide. The gate dielectric may be about 60 Å A thick for the access gate 330 and about 100 Å A thick for floating gate 334. Other types of dielectrics or thicknesses may also be useful.

As shown, the control gate 338 is narrower than the floating gate. For example, the sides of the control gate are offset from the sides of the floating gate. In one embodiment, the offset of the control gate from a second side is greater than from a first side. The first side is adjacent to the first or access gate and the second side is adjacent to the second terminal and erase gate.

Separating the control and floating gates is a storage gate dielectric 336. The storage gate dielectric may be a storage dielectric stack. For example, the storage gate dielectric may be an oxide/nitride/oxide (ONO) stack. The ONO stack may be formed by, for example, CVD. The thickness of the ONO stack may be about 150 Å. Other suitable types of floating gates or storage gate dielectrics, thicknesses, as well as forming techniques may also be useful.

A first intergate sidewall dielectric 337 is disposed between the first and second gates. For example, the first intergate sidewall dielectric is disposed between the access gate and the floating and control gates. The first intergate sidewall dielectric may include a plurality of dielectric layers. For example, the first intergate dielectric layer may include a first control gate sidewall dielectric stack having a plurality of dielectric layers and a first floating gate sidewall layer.

The first control gate sidewall dielectric stack may include first and second first control gate sidewall dielectric layers (not shown). The first control gate sidewall dielectric layer may be a high temperature oxide (HTO) over on the sidewalls of the control gate and second control gate sidewall dielectric layer may be a silicon nitride layer disposed over the first control gate sidewall dielectric layer. The thickness of the first control gate sidewall dielectric layer may be about 100 Å and the thickness of the second control gate sidewall dielectric layer may be about 150 Å. Other thicknesses may also be useful. The first control gate sidewall dielectric stack, for example, defines the offset of the control gate with respect to the floating gate on the first side of the storage gate.

As for the first floating gate sidewall layer, it may be a HTO layer. In one embodiment, the first floating gate sidewall layer extends the height of the second gate. For example, the first floating gate sidewall layer may be a spacer layer covering the first control gate sidewall dielectric stack and sidewall of the floating gate. The thickness of the floating gate sidewall layer, for example, may be about 200 Å. Other thicknesses may also be useful. The thickness defines the isolation distance between the floating gate and the access gate.

A second intergate sidewall dielectric 338 is disposed between the first and erase gates. For example, the second intergate sidewall dielectric is disposed between the control and floating gates and the erase gate. The second intergate sidewall dielectric may include a plurality of dielectric layers. For example, the second intergate dielectric layer may include a second control gate sidewall dielectric stack having a plurality of dielectric layers and a second floating gate sidewall layer.

The second control gate sidewall dielectric stack may include first, second and third second control gate sidewall dielectric layers (not shown). The first control gate sidewall dielectric layer may be a high temperature oxide (HTO) over on the sidewalls of the control gate, the second control gate sidewall dielectric layer may be a silicon nitride layer disposed over the first control gate sidewall dielectric layer. The thickness of the first control gate sidewall dielectric layer may be about 100 Å and the thickness of the second control gate sidewall dielectric layer may be about 150 Å. Other thicknesses may also be useful. The first and second control gate sidewall dielectric layers of the second control gate sidewall dielectric stack may be similar to that of the first control gate sidewall dielectric stack. For example, the first and second layers of the dielectric stacks may be formed from the same process. Other configurations of the control gate sidewall dielectric stacks may also be useful.

The third second control gate sidewall dielectric layer may be a silicon oxide layer. For example, the silicon oxide layer may be formed by chemical vapor deposition (CVD). Other techniques for forming the third second control gate sidewall dielectric layer may also be useful. The thickness of the third second control gate sidewall dielectric layer may be about 100 Å. Other thicknesses may also be useful. The second control gate sidewall dielectric stack defines the offset of the control gate from the floating gate on the second side. The offset provides for better erase performance of the memory cell.

As for the second floating gate sidewall layer, it may be a HTO layer. In one embodiment, the second floating gate sidewall layer extends the height of the second gate. For example, the first floating gate sidewall layer may be a spacer layer covering the first control gate sidewall dielectric stack and sidewall of the floating gate. The thickness of the floating gate sidewall layer, for example, may be about 150 Å. Other thicknesses may also be useful. The thickness defines the isolation distance between the floating gate and the access gate. In one embodiment, the second floating gate sidewall dielectric layer may be similar or formed from the same process as the first floating gate sidewall dielectric layer. Other configurations of the floating gate sidewall dielectric layers may also be useful.

The floating gate 334 is separated from the substrate 305 by a floating gate dielectric 332 and the control gate 338 is separated from the floating gate by a storage gate dielectric 336. The floating gate dielectric, in one embodiment, is a thermal oxide. As for the storage gate dielectric, it is an oxide/nitride/oxide (ONO) stack. The ONO stack may be formed by, for example, CVD. Other suitable types of floating gates or storage gate dielectrics as well as forming techniques may also be useful.

The storage gate 340 includes a hard mask layer 339 over it. For example, the hard mask is disposed over the control gate. The hard mask, for example, is silicon oxide. The hard mask, for example, may be formed by CVD. Other suitable types of hard mask or dielectric materials and forming techniques may also be useful.

As for the first gate 330, it serves as an access gate or wordline. The first gate is disposed adjacent to the storage gate and first cell terminal 322. An access gate dielectric layer 342, such as thermal oxide, is provided below the access gate and on the substrate. The access gate or wordline, for example, may be polysilicon. The access gate may be formed by CVD. Other suitable types of access gates or forming techniques may also be useful. The storage gate and access gate may be gate conductors. For example, the gates form common gates for a row of memory cells.

The first and second S/D regions 322 and 324 are heavily doped first polarity type doped regions. For example, first polarity type doped S/D regions are for first polarity type cell transistors. In one embodiment, the first polarity type is n-type for a n-type cell transistor. Providing p-type S/D regions may also be useful for p-type cell transistors. The dopant concentration of the S/D regions, for example, are about $3E19$ cm$^{-3}$. Other dopant concentrations may also be useful. The dopant concentration may vary depending on technology node.

In one embodiment, the first and second S/D regions are formed using different processes. For example, the second S/D region is formed first after patterning the second gate. As for the first S/D region, it is formed after forming the first gate, which is formed after forming the second gate. Other process flow sequences for forming the S/D regions may also be useful.

The first S/D region may be referred to as a drain and the second S/D region may be referred to as a source. Other designations for the S/D regions may also be useful. In one embodiment, the cell pairs share a common second S/D region or source. For example, the source of the first and second memory cells of the memory cell pair is the same. Other configurations of memory cell pairs may also be useful.

In one embodiment, the first S/D terminal includes a lightly doped drain (LDD) extension region 323. The LDD extension is a lightly doped first polarity type region which extends from the first S/D region to under the gate. The dopant concentration of the LDD extension region may be about $5E18$ cm$^{-3}$. A halo region may be disposed adjacent to the LDD extension region. The halo region may be a p-type second polarity type dope region, which is opposite of the S/D and LDD regions. The dopant concentration of the halo region may be about $3E18$ cm$^{-3}$. Other dopant concentrations for the LDD extension and halo regions may also be useful. The dopant concentration may vary depending on technology node.

The S/D, LDD extension and halo regions may be formed using separate implant processes. In one embodiment, the LDD extension and halo regions may be formed using the same implant mask but different implant processes. The LDD extension and halo regions may be formed using quad tilt angled implants. As for the S/D regions, they are formed using a different implant process with a different implant mask. For example, the first S/D region is formed separately from the second S/D region.

In one embodiment, the second S/D region or source does not include LDD extension regions. The second S/D region also does not include halo regions. For example, no LDD extension or halo regions are provided under the second gates of the first and second memory cells. The implant mask used to form LDD extension regions and halo regions is disposed over the second S/D region, protection dopants from being implanted to form LDD extension and halo regions for the second S/D region. The second S/D region serves as a SL of the memory cell. The second S/D region, for example, may be a common SL for a row of memory cells or cell pairs. For example, the second S/D region may extend the length of a row and serve as a common S/D region for a row of memory cells or cell pairs.

A third gate 350 is disposed over the second S/D region. The third gate serves as an erase gate. The erase gate, for example, is a polysilicon gate formed by CVD. Other suitable types of gate materials or forming techniques may also be useful. The erase gate is isolated from the second S/D region by an erase gate dielectric 370. The erase gate dielectric, for example, is a thermal oxide layer. Other suitable dielectric materials may also be used as the erase gate dielectric. The thickness of the erase gate dielectric should be sufficient to electrically isolate the erase gate from the second S/D region. An erase gate sidewall dielectric may be provided between the erase gate and second gate sidewalls. The erase gate sidewall dielectric, for example, may be an HTO dielectric layer and serve as a tunneling dielectric layer.

As shown, the erase gate is coplanar with the second or control gate. In some embodiments, the erase gate may be recessed. For example, a top surface of the erase gate is below the top of the second gate. Other configurations of the erase gate and second gate may also be useful.

Providing the third gate 350 region without LDD extension, halo and first S/D implants which are performed after formation of erase gate dielectric prevents dopants from being trapped in the erase gate dielectric. For example, dopants from implants used to form the LDD extension, halo and first S/D regions may be trapped in the erase gate dielectric. The trapped dopants, for example, may penetrate through the erase gate and trap up or damage tunnel oxide, creating an electrical connection between the erase gate and the floating gate. This can cause the device to fail endurance/cycling.

A dielectric sidewall spacer 369 may be provided on the sidewall of the first gate adjacent to the first S/D region. In one embodiment, the dielectric spacer is a silicon nitride spacer. Other types of dielectric spacers may also be useful. For example, the spacer may be spacer stacks having multiple dielectric layers. To form the nitride spacer, a spacer layer may be formed and anisotropically etched, leaving spacer on the sidewall of the first gate. The spacer layer, for example, may be formed by CVD. Other techniques for forming the spacer may also be useful. In the case that the erase gate is recessed, sidewall spacer may be disposed on the second gate exposed by the recessed erase gate.

The sidewall spacer serves to facilitate forming the first LDD region. For example, tilt implants are used to form LDD extension region and halo region, enabling them to extend below the spacer and part of the first gate. After forming the LDD extension and halo regions, a vertical implant is used to form the first S/D region. Other techniques for forming LDD extension, halo and first S/D region may also be useful.

In one embodiment, a silicide block 368 is disposed at least over the erase gate. The silicide block at least covers the erase gate completely. The silicide block is a dielectric silicide block. For example, the silicide block is a silicon oxide silicide block. Other types of dielectric materials may also be useful to form the silicide block. The silicide block prevents formation of silicide on the erase gate. The thickness of the silicide block may be about 200 Å. Other thicknesses may also be useful.

In one embodiment, the silicide block completely covers the erase gate and a portion of the second or control gates, as shown in FIG. 3a. For example, the silicide block may cover about half of the second gate. Providing a silicide block which covers other amounts of the second gate may also be useful. For example, the overlap of the silicide block onto the second gate should be sufficient to take into processing variations to ensure that the silicide block completely covers the erase gate and isolates the control gate from the erase gate. The silicide block may extend the length of a row of memory cells, except in pick up areas. The pick-up areas are areas where via contacts are provided to stitch or couple metal lines in metal level or levels of the back-end-of-line (BEOL) interconnect dielectric (ILD) to the gate conductors. For example, the silicide block is opened in the pick-up areas.

Metal silicide contacts 380 are disposed on exposed silicon portions of the memory cell. As shown, silicide contacts are disposed on the first S/D region and the first gate. The hard mask on the second gate prevents formation of silicide contacts. In one embodiment, silicide contacts are formed on the control gate 338 at the pick-up areas. The pick-up areas are areas on the second gate where via contacts are provided to stitch or couple metal lines in metal level or levels of the back-end-of-line (BEOL) interconnect dielectric (ILD) to the second gate. For example, the hard mask and/or silicide block on the second gate are opened in the pick-up areas. In addition, pick-up areas may be provided for the different gate conductors, including the erase gate conductor and SL. However, the pick-up areas may be disposed in different locations on the gate conductors. Other configurations of pick-up areas may also be useful.

The silicide contact may be a nickel-based silicide contact. For example, the silicide contact may be formed of nickel or nickel alloy. To form metal silicide contacts, a metal layer is formed over the substrate and annealed to cause a reaction with the metal and silicon. The reaction forms metal silicide. Excess unreacted metal is removed by, for example, a wet etch.

By preventing the formation of a silicide contact on the erase gate 350, bridging between erase gate and control gate is avoided. For example, the hard mask over the control gate adjacent to the erase gate may erode, causing silicide bridging, shorting the erase and control gates. Furthermore, the RC delay caused by unsilicided EG poly can be neglected as the erase time is ~10 mS.

In another embodiment, as shown in FIG. 3b, the silicide block completely covers both the erase and second gates as well as extending into a portion of the first gate. The overlap portion should be sufficient to ensure complete coverage of the control gate by the silicide block taking process variations into consideration. However, the overlap portion should be minimal to avoid unnecessary increase in resistance in the first gate. By completely covering the control gate and a portion of the first gate, silicide bridging between the two gates is avoided along with the advantages discussed with respect to the embodiment of FIG. 3a.

As shown, the cell transistors of the memory cell pair share a common second S/D region. Likewise, the cell transistors of the memory cell pair share a common erase gate. Other configurations of cell transistors of the memory cell pair may also be useful.

An EGL is coupled to the erase gate and a SL is coupled to the second S/D region. A first wordline ($WL_1$) is coupled to the second gate of the first cell transistor and a first control gate line ($CGL_1$) is coupled to the second gate of the first cell transistor; a second wordline ($WL_2$) is coupled to the access gate of the second cell transistor and a second control gate line ($CGL_2$) is coupled to the control gate of the second cell transistor. Alternatively, the second gate of the first cell transistor serves as the first wordline while the second gate of the second cell transistor serves as the second wordline. As for the first terminals of the cell transistors, they are coupled to a common bitline (BL). For example, the cells of the memory cell pair are part of the same column of memory cells. Memory cells may be interconnected by WLs, CGLs, EGLs, SLs and BLs to form a memory array.

A dielectric layer 389 is disposed over the memory cell. The dielectric layer, for example, serves as a contact level of an interlevel dielectric (ILD) layer. For example, the dielectric layer serves as a contact level or CA level of the first ILD level or layer. Contacts (not shown) are coupled to the various terminals of the memory cell. For example, contacts are coupled to the first and second S/D regions, control gates and access gates of the memory cell. Contact in the CA level may be tungsten contacts. Other suitable types of contacts may also be useful. Conductive lines may be provided in a metal level of the ILD layer above the contact level dielectric layer. For example, conductive lines may be provided in the first metal level (M1) of the first ILD layer. Conductive lines in M1 may be copper conductive lines. Contacts and conductive lines in CA and M1 may be formed by single damascene techniques. Additional ILD layers with contact and metal levels are provided. Contacts and conductive lines in the additional ILD layers may be copper contacts and formed by, for example, dual damascene technique.

Lines disposed in the same direction may be provided in the same metal level. Different direction lines are provided in different metal levels. For example, in the case where CGLs, WLs, SLs and EGLs are disposed in a first direction, they may be disposed in the same metal level, such as the first metal level (M1) while BLs which are disposed in a second direction, may be provided in a different metal level, such as the second metal level (M2). Other suitable configurations of conductive lines may also be useful.

Figure 4A:
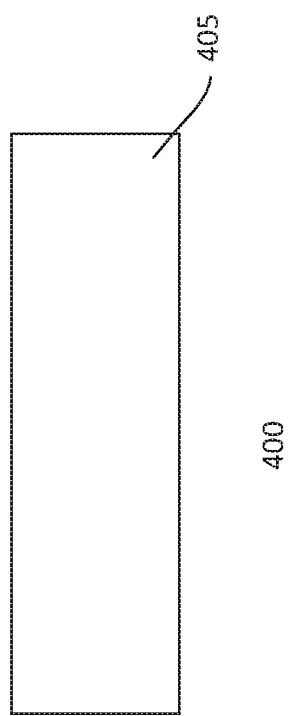
FIGS. 4a-4p show cross-sectional views of an embodiment of a process for forming a device.
Figure 4B:
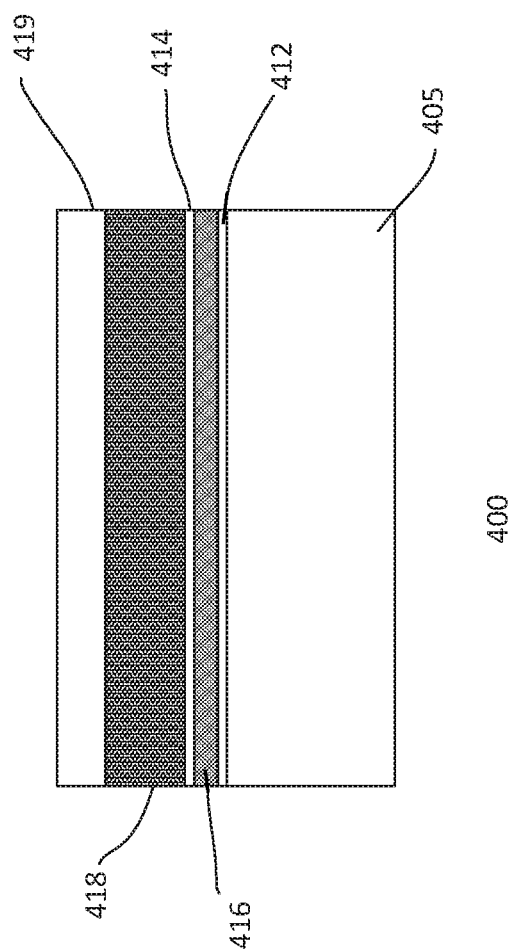
Figure 4D:
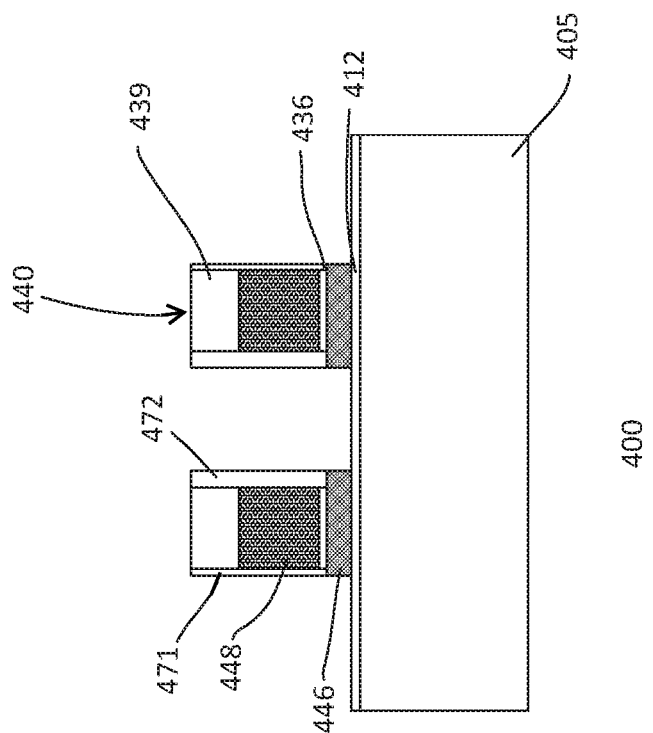
Figure 4G:
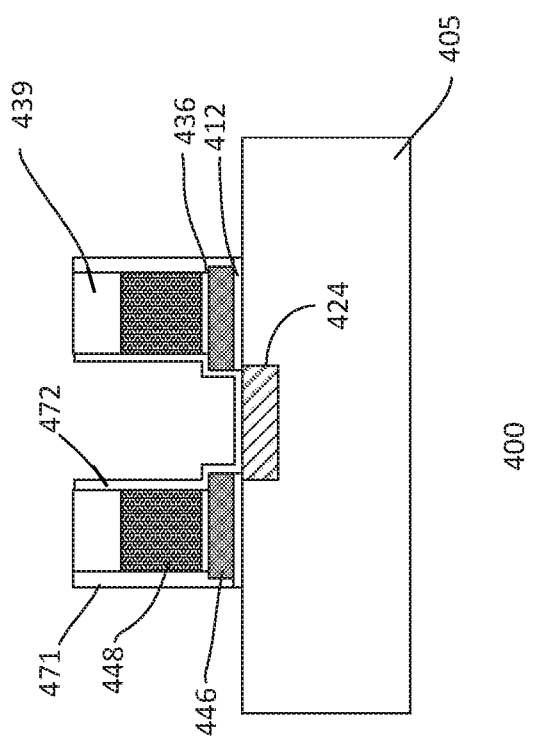
Figure 4H:
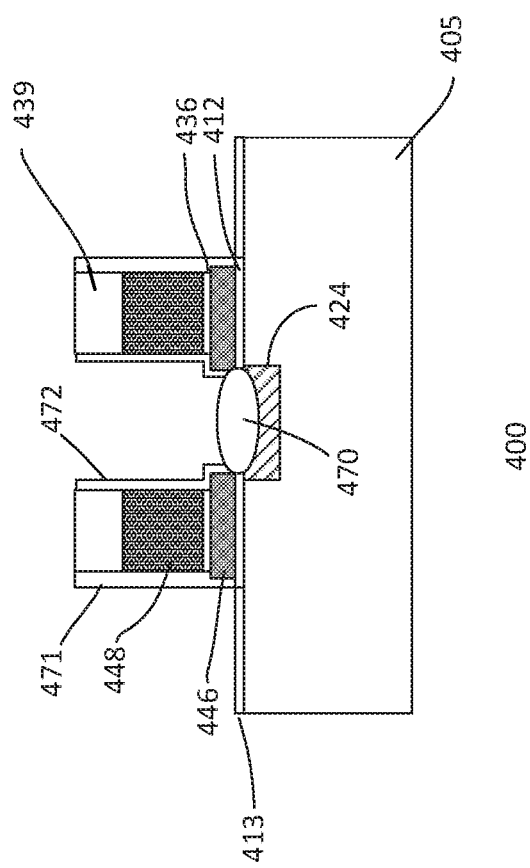
Figure 4I:
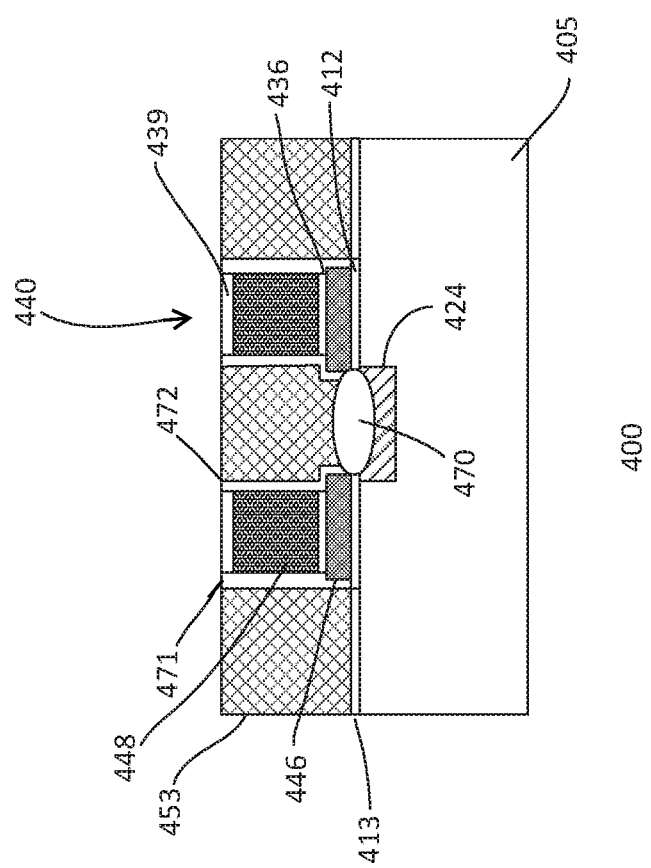
Figure 4J:
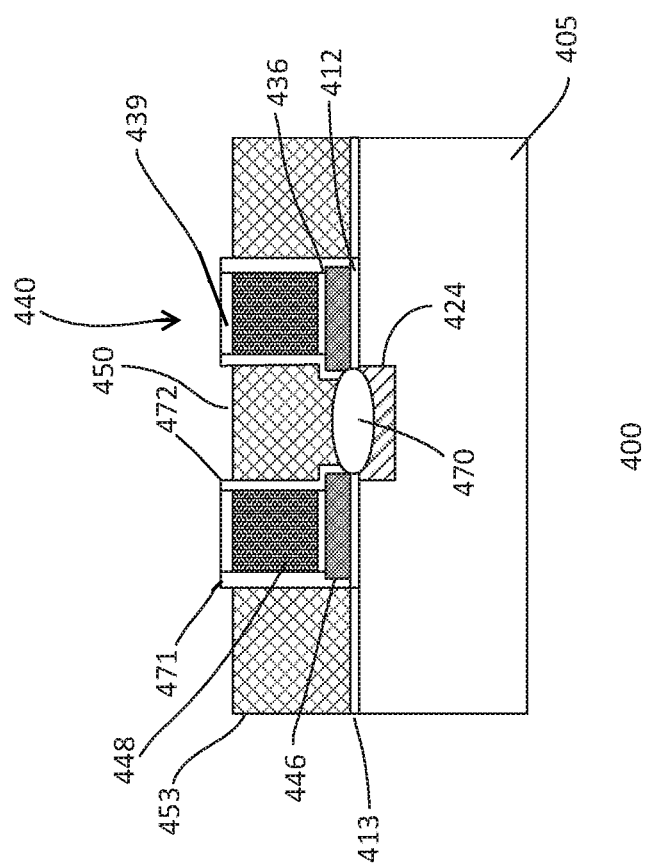
Figure 4K:
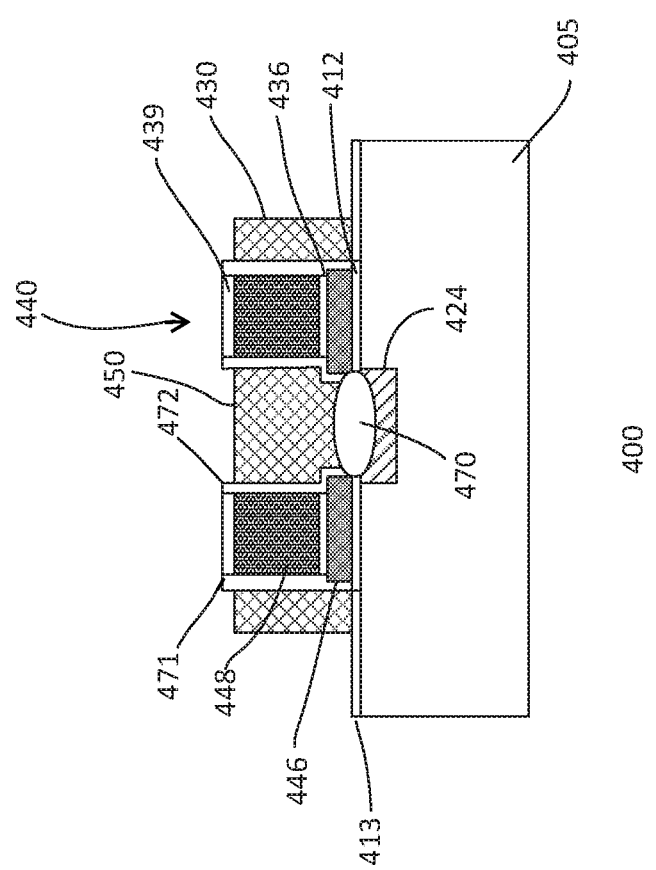
Figure 41:
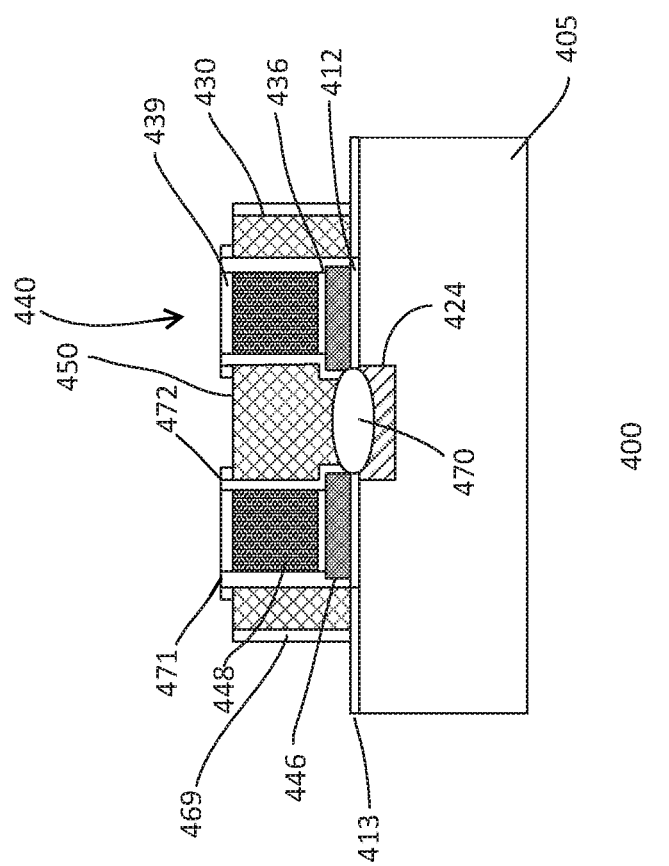
Figure 4M:
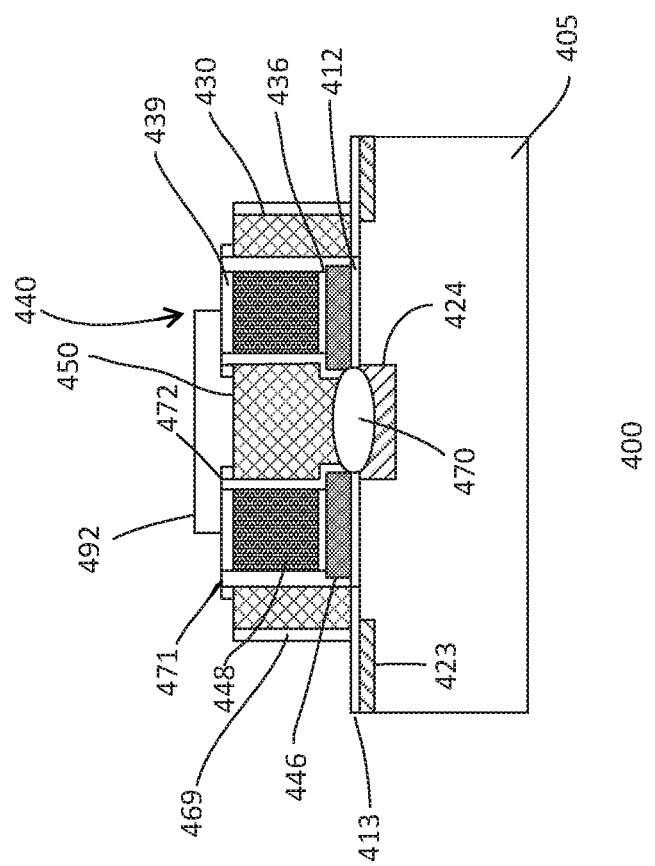
Figure 4N:
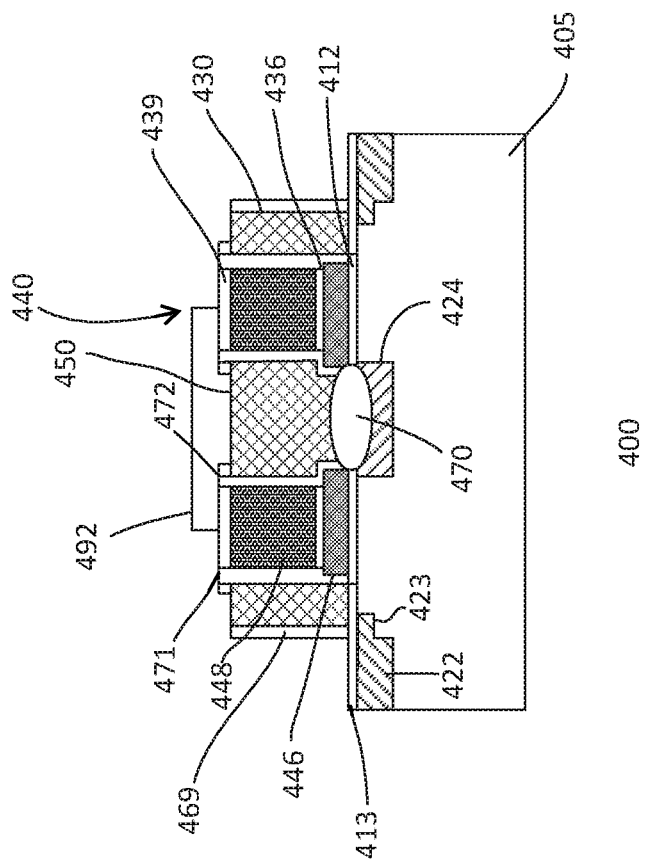
Figure 4O:
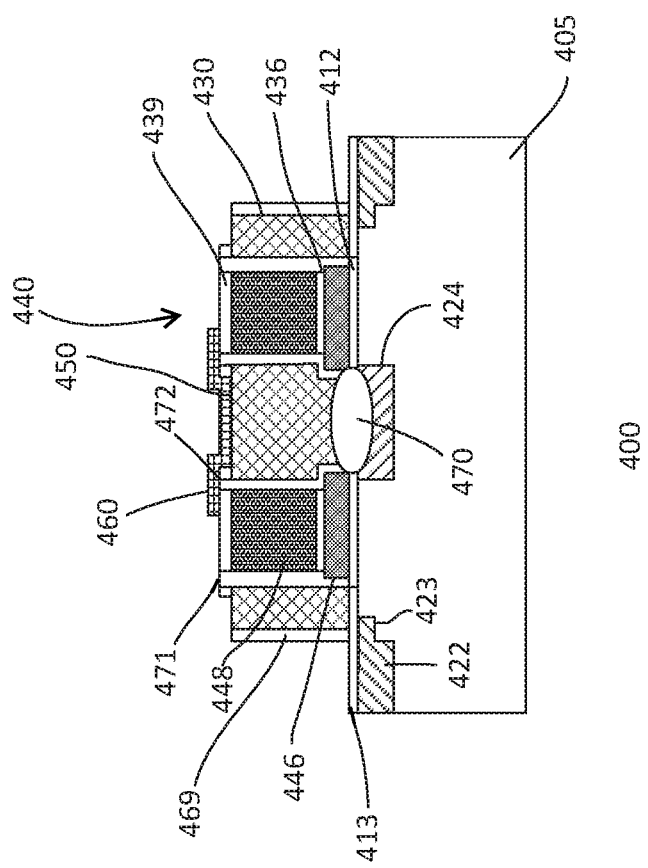
Figure 4P:
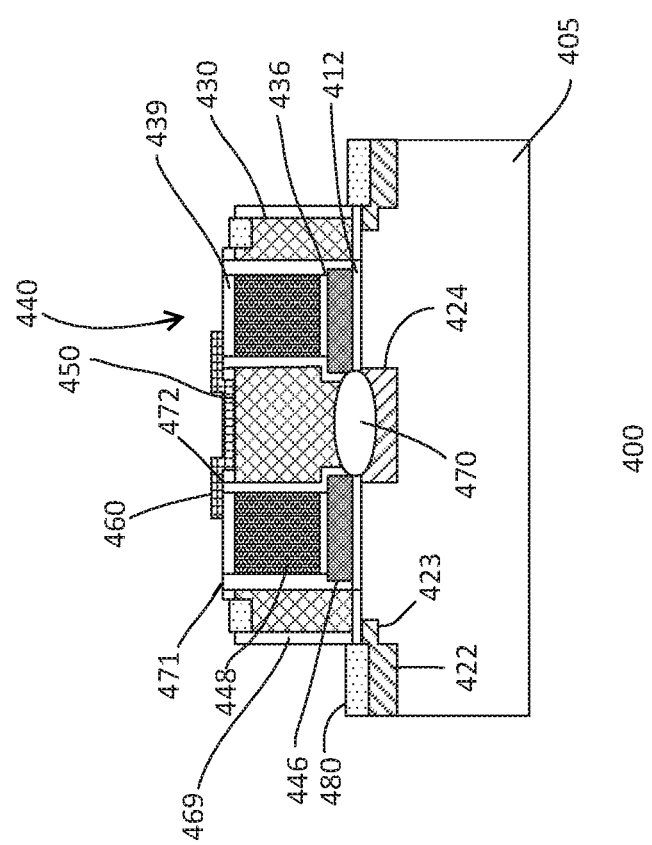

FIGS. 4a-4p show cross-sectional views of an embodiment of a process 400 for forming a device. The cross-sectional views, for example, are along the bitline direction of the device. The device, for example, is similar to that described in FIGS. 1-3b. Common elements may not be described or described in detail. The cross-sectional views illustrate a portion of the device. For example, the cross-sectional views illustrate a portion of the array region of the device. As discussed, the device may include other device regions (not shown), such as logic regions, including HV, MV and LV regions. The various regions include device wells for respective devices. For example, the array region includes an array well while HV regions include HV p wells for HV n-type devices and HV n wells for HV p-type devices, MV regions include MV p wells for MV n-type devices and MV n wells for MV p-type devices, and LV regions include LV p wells for LV n-type devices and LV n wells for LV p-type devices.

Referring to FIG. 4a, a substrate 405 is provided. The substrate, for example, may be a silicon substrate. The substrate can be lightly doped with p-type dopants. Other types of semiconductor substrates may also be used. For example, the substrate may be silicon germanium or silicon-on-insulator (SOI) as well as intrinsic or doped with other types of dopants or dopant concentrations.

Initial front-end-of-line (FEOL) processing is performed on the substrate 405. For example, the substrate is prepared with isolation regions (not shown), such as shallow trench isolation (STI) regions, defining active regions of the device. For example, exposed portions of the substrate not filled with isolation regions serve as active regions of the device. The active regions, for example, include array, HV, MV and LV regions. Other regions may also be included.

After forming the isolation regions, wells are formed in the substrate. For example, doped wells are formed in the array region and the logic region. The logic region, for example, may include HV, MV and LV regions. The wells may be formed by performing ion implantation using implant masks, such as photoresist. Different wells are formed using different implant processes.

In FIG. 4b, various gate layers are formed on the substrate. This, for example, includes forming a floating gate dielectric layer 412, a floating gate electrode layer 416, a storage gate dielectric layer 414, a control gate electrode layer 418, and a hard mask layer 419. The floating gate dielectric may be a thermal silicon oxide layer while the storage gate dielectric layer 414 may be an ONO stack. As for the gate electrode layers, there may be polysilicon gate electrode layers formed by, for example, CVD. Other types of gate dielectric, storage dielectric and electrode layers or forming techniques may also be useful.

In FIG. 4c, the control gate and storage dielectric layers 418 and 414 are patterned to form control gates over the storage dielectric layer. For example, the hard mask is patterned using a patterned soft mask, such as a patterned photoresist layer. The photoresist layer may be patterned by exposing it with an exposure source through a reticle. The pattern of the reticle is transferred to the photoresist layer after development. For example, the patterned resist mask protects portions of the substrate corresponding to the control gate.

An etch is performed to pattern the hard mask. The etch, for example, is an anisotropic etch, such as a reactive ion etch (RIE). After patterning the hard mask, the photoresist layer may be removed by, for example, ashing. The patterned hard mask 439 serves as an etch mask for patterning the control gate and storage gate dielectric layers 448 and 436. An over etch may be performed to ensure that the storage gate dielectric layer unprotected by the control gate is completely removed.

Illustratively, the portion of the array includes two control gates of a memory cell pair. It is understood that an array includes many more memory cell pairs which form columns and rows of memory cells.

Referring to FIG. 4d, first and second control gate spacers 471 and 472 are formed on first and second sidewalls of the control gates. The spacers may be dielectric spacers. For example, a dielectric layer may be formed over the substrate by, for example, CVD. The spacer layer may be anisotropically etched, such as by RIE, to remove horizontal portions, leaving sidewall spacers. In one embodiment, the spacers are spacer stacks having multiple layers. In one embodiment, the spacer stack includes a nitride layer which is used to form a nitride spacer. An oxide layer is then formed over the nitride spacer. The oxide layer is then anisotropically etched to form oxide spacers over the nitride spacers. In one embodiment, the oxide spacer serves as sacrificial spacers which are subsequently removed.

A gate threshold voltage (Vt) adjustment implant may be performed for the wordline. The implant may be performed using an implant mask (not shown). For example, the implant mask may be a resist mask with openings to the region 440 where access gate or wordline is to be formed. The opening may also expose a portion of the control gate on the access gate side.

After the Vt adjustment implant, the sacrificial spacers on the access gate side of the control gates are removed. For example, the sacrificial spacers exposed by the implant mask are removed, leaving the nitride spacers below. Removal of the exposed sacrificial spacers may be achieved by, for example, a wet etch. This results in the first control gate spacers on the first sidewalls being thinner than the second control gate spacers on the second sidewalls. Thereafter, the implant mask is removed by, for example, ashing. Other suitable removal techniques may also be employed.

The control gate spacers serve as an etch mask for patterning the floating gate layer 446. For example, an anisotropic etch, such as RIE, is used to remove exposed portions of the floating gate electrode layer. As shown, the floating gate dielectric layer remains on the substrate. Removing the exposed portions of floating gate dielectric layer 412 may also be useful. This forms second gates of the memory cell pair. For example, this forms the storage gates of the memory cell pair.

In FIG. 4e, full spacers 473 are formed on sidewalls of the control and floating gates. For example, a dielectric layer, such as silicon oxide, is deposited on the substrate and anisotropically etched to form the full spacers. The silicon oxide layer may be a high temperature oxide (HTO) layer. Other types of dielectric layer may also be useful.

Referring to FIG. 4f, an implant is performed to form a source region 423 on the second side of the control gate. For example, an implant is formed between the second gates of the memory cell pair. The implant, for example, is a vertical implant. The implant implants first polarity type dopants to form a heavily doped source region. An implant mask (not shown), such as a photoresist mask, may be employed to provide an opening between the gates to form the source region. The source region, for example, serves as a buried SL. For example, the buried SL extends a length of a row of memory cells.

Referring to FIG. 4g, the sacrificial and full spacers on the second sidewalls are removed after the implant to form the source 424. For example, the sacrificial spacers and full spacers which are exposed by the implant mask are removed using, for example, a wet etch. The wet etch may also remove the dielectric layer on the surface of the substrate above the source. This leaves the nitride spacers on the second sidewalls of the control gate. The implant mask may be removed. For example, the implant mask may be removed by ashing. An anneal may be performed to activate and diffuse the source dopants, completing the formation of the source 424.

A tunnel oxide layer is formed on the substrate. The tunnel oxide, for example, is a HTO oxide. The HTO oxide layer is formed by, for example, CVD. After forming the tunnel oxide layer, a HTO anneal is performed to densify the oxide layer. The tunnel oxide is then patterned, leaving the tunnel oxide 472 lining the second gate sidewalls and over the source. The patterning is performed by mask and etch techniques. For example, a patterned mask, such as photoresist, is used as an etch mask to etch the tunnel oxide layer. The etch, for example, is an anisotropic etch, such as RIE. Other types of etches may also be useful. To ensure that the tunnel oxide completely lines the second sidewalls of the second gate, the mask may protect a portion of the second gate, leaving the tunnel oxide layer partially covering the second gate (not shown). The mask is removed after patterning the tunneling oxide layer.

Referring to FIG. 4h, a WL gate dielectric layer 413 is formed on the substrate. The WL gate dielectric layer, for example, is a thermal oxide layer. In one embodiment, an erase gate dielectric 470 is also formed on the substrate over the source region. The erase gate dielectric, for example, is a thermal oxide layer. For example, the WL gate dielectric and erase gate dielectric may be formed in the same process.

In FIG. 4i, a gate WL gate electrode layer 453 is formed on the substrate, filling the gaps between the second gates. The gate electrode layer, for example, is a polysilicon layer. The polysilicon may be doped polysilicon, for example, to reduce sheet resistance. The polysilicon may be doped with first polarity type dopants. The gate electrode layer may be formed by CVD. Forming the gate electrode layer by other techniques may also be useful. The substrate is planarized, removing excess gate electrode layer and forming a planar top surface, exposing the second gates. For example, a CMP is performed to planarize the substrate.

As shown in FIG. 4j, the WL gate electrode layer is recessed. For example, a height of the WL gate electrode layer is reduced to a desired height below the top of the second gate. An etch back is performed to recess the WL gate electrode layer to the desired height. As shown, the height of the WL gate electrode layer is recessed to about the interface of the hard mask and control gate. Recessing the WL gate electrode by other amounts may also be useful. In some embodiments, the WL gate electrode layer is not recessed depending on the technology node. In such case, the WL gate electrode layer maintains its coplanar top surface with the second gates. An erase gate 450 is disposed over the erase gate dielectric 470 between the second gates.

In FIG. 4k, the WL gate electrode layer is patterned to form access gates 430 of the memory cells. The access gates serve as WLs. In one embodiment, a mask, such as a resist mask, is employed to pattern the WL gate electrode layer to form the access gates. The mask protects the region over the erase gate 450, since it is already formed, and other regions where the access gates are to be formed. The etch, for example, is a RIE.

After the access gates are formed, sidewall spacers 469 are formed on sidewalls of the access gates or WLs and exposed portions of the storage gate as well as sidewalls of the logic gates, as shown in FIG. 4l. The sidewall spacers, for example, are nitride spacers. Other types of spacers may also be useful. The spacers, for example, are used to form lightly doped drain extension (LDD) regions.

Referring to FIG. 4m, an implant mask is 492 is formed on the substrate. The implant mask, in one embodiment, includes opening for the drain region adjacent to the first gate while protecting the erase gate. A LDD extension implant is performed. The implant forms LDD extension regions 423 in the drain regions adjacent to the first or access gate. The implant, for example, may be a tilt implant. In some embodiments, a halo implant may also be performed to form halo regions. The halo regions, for example, are second polarity type regions which extend beyond the LDD extension regions. The halo implant, for example, may be a tilt implant.

In FIG. 4n, a drain implant is performed. The drain implant, for example, is a vertical implant which implants first polarity type dopants. The implant forms first polarity type heavily doped drain regions 422 adjacent to the first or access gate. The implant mask protects the erase gate from the LDD extension, halo and drain implants.

Referring to FIG. 4o, the implant mask is removed. For example, the implant mask may be removed by ashing. A silicide block 460 is formed on the substrate. In one embodiment, the silicide block covers the erase gate. As shown, the silicide block extends partially over the control gate to ensure that the erase gate is completely covered. The silicide block, for example, is a dielectric layer, such as silicon oxide. Other types of dielectric materials may also be used to form the silicide block. To form the silicide block, a silicide block layer is formed on the substrate by, for example, CVD. The silicide block layer is then patterned using mask and etch techniques. For example, an anisotropic etch, such as RIE, removes silicide block layer exposed by a mask, leaving the silicide block protecting the erase gate.

As shown in FIG. 4p, silicide contacts 480 are formed on exposed silicon portions of the memory cell. For example, silicide contacts are formed on the drain regions and access gates of the memory cells. The silicide contacts may be a nickel based silicide contact, such as nickel-alloy. To form the silicide contacts, a metal layer is formed on the substrate. For example, a metal layer may be formed on the substrate by sputtering. An anneal is performed to cause a reaction with the silicon. Unreacted metal is removed by, for example, a wet etch, leaving the silicide contacts.

The process continues with back-end-of-line (BEOL) processing to form interconnects and passivation. After BEOL is completed, the wafer is diced into individual chips, assembled and tested. Other suitable processes may also be included.

Figure 5:
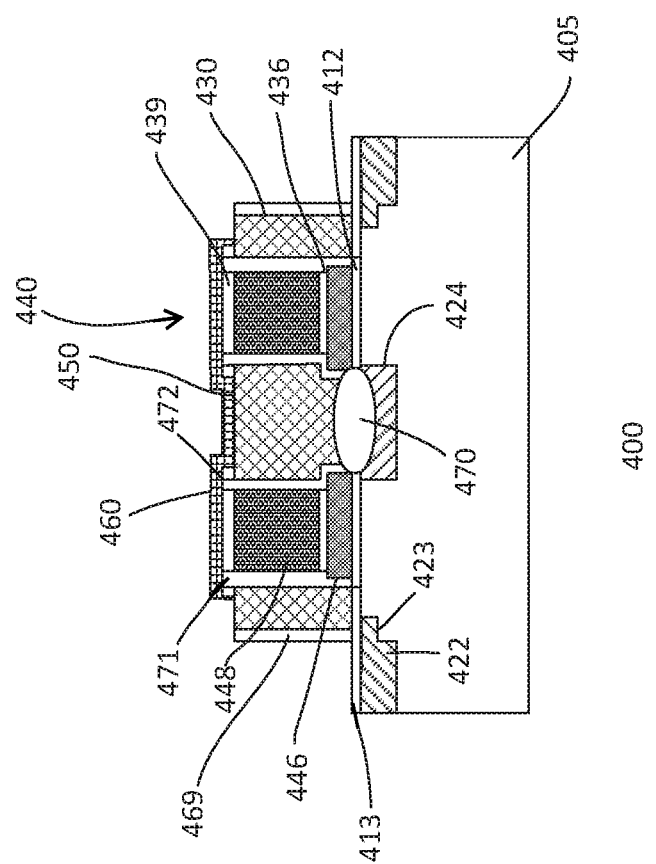
FIG. 5 shows an alternative embodiment for forming a device.

FIG. 5 shows an alternative embodiment of forming a device. As shown, FIG. 5 shows the device at the stage of processing as in FIG. 4o. Common elements may not be described or described in detail. As shown, a silicide block 460 is formed on the substrate, protecting the erase gate. In one embodiment, the silicide block also covers the control gate completely. To ensure that the silicide block covers the control gate completely, it extends partially onto the access gate. The process continues as described from FIG. 4o to FIG. 4p.

The embodiments as described result in advantages. For example, during formation of the control gates, the etch stops on top of the storage gate dielectric layer. Thus, the underlying floating gate electrode layer is not processed or consumed during formation of the control gates. Since the floating gate electrode layer is preserved or not removed when the control gates are defined, this provides better control of floating gate electrode thickness and avoids floating gate gauging as well as silicon substrate gauging. This also allows the floating gate electrode to shrink further without the silicon gauging concern. In addition, the embodiment as described in FIGS. 4a-4p provides lower NVM cell stack which is closer to logic stack to be formed, enabling better control of process margin. Furthermore, since hard mask used to define the control gate is less consumed by this process, it allows a thinner hard mask layer to be used. This provides more margins for control gate etch tuning, leading to better control gate profile and critical dimension (CD) uniformity. Moreover, the method as described in FIGS. 4a-4p is highly compatible with current logic processing and no additional investment in new equipment is required. Therefore, a more reliable NVM device can be formed together with logic devices without incurring additional manufacturing costs.

The embodiments may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method for forming a device comprising:
   providing a substrate prepared with a memory region;
   forming at least a memory cell on the memory region, wherein forming the memory cell comprises
      forming a cell gate, the cell gate comprising an access gate disposed laterally adjacent to a storage gate, wherein a dielectric hard mask layer is disposed atop of the storage gate, and
      forming an erase gate laterally adjacent to the storage gate;
   forming a silicide block on the erase gate, wherein the silicide block covers an exposed top surface of the erase gate; and
   forming metal silicide contacts on exposed silicon surface of the memory cell after forming the silicide block, wherein the silicide block includes an opening in a pick-up area of the erase gate.

2. The method of claim 1 wherein openings are formed in the dielectric hard mask layer to expose pick-up areas of the storage gate of the memory cell.

3. The method of claim 1 wherein the silicide block direct contacts the exposed top surface of the erase gate and extends over a portion of the cell gate, wherein the silicide block contacts the dielectric hard mask layer atop the storage gate.

4. The method of claim 1 comprising forming a memory cell pair on the memory region prior to forming the erase gate, wherein the memory cell corresponds to a first memory cell of the memory cell pair and forming the memory cell pair comprises forming a second memory cell of the memory cell pair prior to forming the erase gate, wherein forming the second memory cell comprises forming a second cell gate having a second access gate laterally adjacent to a second storage gate, wherein a second dielectric hard mask layer is disposed atop of the second storage gate of the second cell gate, wherein the erase gate is formed interjacent the storage gates of the first and second memory cells.

5. The method of claim 4 wherein the storage gate of each of the first and second memory cells comprises a control gate disposed over a floating gate, wherein forming the first and second memory cells comprise performing an over etch process to pattern a storage gate dielectric layer disposed between the control gates and the floating gates of the first and second memory cells.

6. A method for forming a device comprising:
   providing a substrate prepared with a memory region;
   forming at least a memory cell on the memory region, wherein forming the memory cell comprises
      forming a cell gate, the cell gate comprising an access gate disposed laterally adjacent to a storage gate, wherein a dielectric hard mask layer is disposed atop of the storage gate, and
      forming an erase gate laterally adjacent to the storage gate;
   forming a memory cell pair on the memory region prior to forming the erase gate, wherein the memory cell corresponds to a first memory cell of the memory cell pair and forming the memory cell pair comprises forming a second memory cell of the memory cell pair prior to forming the erase gate, wherein forming the second memory cell comprises forming a second cell gate having a second access gate laterally adjacent to a second storage gate, wherein a second dielectric hard mask layer is disposed atop of the second storage gate of the second cell gate, wherein the erase gate is formed interjacent the storage gates of the first and second memory cells;
   forming a silicide block on the erase gate, wherein the silicide block covers an exposed top surface of the erase gate; and
   forming metal silicide contacts on exposed silicon surface of the memory cell after forming the silicide block.

7. The method of claim 6 wherein the storage gate of each of the first and second memory cells comprises a control gate disposed over a floating gate, wherein forming the first and second memory cells comprise performing an over etch process to pattern a storage gate dielectric layer disposed between the control gates and the floating gates of the first and second memory cells.

8. The method of claim 6 comprising:
   forming a first source/drain (S/D) region adjacent to each access gate of the first and second memory cells; and
   forming a second S/D region between the storage gates of the first and second memory cells, wherein the second S/D region underlaps the erase gate.

9. The method of claim 8 wherein the silicide block is formed after forming the first and second S/D regions.

10. The method of claim 6 wherein the silicide block directly contacts the erase gate and partially overlaps each storage gate of the first and second memory cells.

11. The method of claim 10 wherein the silicide block partially overlaps and contacts the dielectric hard mask layer disposed atop the storage gates of the first and second memory cells.

12. The method of claim 6 wherein the erase gate and the storage gates of the first and second memory cells extend along a row of memory cells to serve as common erase gate and storage gates of the row of memory cells.

13. The method of claim 12 wherein the silicide block extends along a length of the erase gate, wherein the dielectric hard mask layers extends along a length of the storage gates of the first and second memory cells, wherein the silicide block and the dielectric hard mask layers comprise openings corresponding to locations of pick-up areas of the storage gates and the erase gate.

14. The method of claim 13 wherein pick-up areas of the storage gates are located at different locations compared to pick-up areas of the erase gate.

15. The method of claim 6 wherein the silicide block includes an opening in a pick-up area of the erase gate.

16. A method for forming a device comprising:
   providing a substrate prepared with a memory cell region; and
   forming a memory cell pair having first and second memory cells on the memory cell region, wherein forming the memory cell pair comprises
      forming a first cell gate of the first memory cell, and forming a second cell gate of the second memory cell, wherein each of the first and second cell gates comprises a split gate having an access gate laterally adjacent to a storage gate, and forming an erase gate interjacent the storage gates of the first and second memory cells, wherein the erase gate is separated from the storage gates by sidewall dielectric disposed on sidewalls of the storage gates;

forming a silicide block on the erase gate, wherein the silicide block covers an exposed top surface of the erase gate, wherein the silicide block extends to overlap a portion of each of the first and second cell gates of the first and second memory cells, wherein the silicide block comprises openings in pick-up areas of the erase gate; and forming metal silicide contacts on exposed silicon surface of the first and second memory cells after forming the silicide block.

17. The method of claim 16 wherein the silicide block overlaps the storage gates of the first and second memory cells and extends to overlap a portion of the access gates of the first and second memory cells.

18. The method of claim 16 wherein the silicide block directly contacts and completely covers the exposed top surface of the erase gate.

19. The method of claim 16 wherein forming the metal silicide contacts comprises forming a metal layer over the substrate and annealing the metal layer to form the metal silicide contacts, wherein excess unreacted metal is removed after forming the metal silicide contacts.

20. The method of claim 16 wherein forming the first and the second cell gates comprises performing an over etch to pattern a storage gate dielectric layer and ensure that exposed portions of the storage gate dielectric layer is completely removed.

* * * * *